United States Patent
Hosaka et al.

(10) Patent No.: US 10,259,329 B2
(45) Date of Patent: Apr. 16, 2019

(54) POWER CONVERSION APPARATUS AND JUNCTION BOX

(71) Applicant: PANASONIC INTELLECTUAL PROPERTY MANAGEMENT CO., LTD., Osaka (JP)

(72) Inventors: Ryota Hosaka, Tokyo (JP); Kazushige Kakutani, Kanagawa (JP); Kenji Taguchi, Kanagawa (JP); Takashi Kamiya, Shizuoka (JP); Nobuo Yamamoto, Shizuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 297 days.

(21) Appl. No.: 14/777,594

(22) PCT Filed: Mar. 28, 2014

(86) PCT No.: PCT/JP2014/001859
§ 371 (c)(1),
(2) Date: Sep. 16, 2015

(87) PCT Pub. No.: WO2014/162712
PCT Pub. Date: Oct. 9, 2014

(65) Prior Publication Data
US 2016/0272073 A1 Sep. 22, 2016

(30) Foreign Application Priority Data

Apr. 4, 2013 (JP) .................................. 2013-078544
Apr. 4, 2013 (JP) .................................. 2013-078546
Jul. 4, 2013 (JP) .................................. 2013-140526

(51) Int. Cl.
*B60L 11/18* (2006.01)
*H02M 7/44* (2006.01)
(Continued)

(52) U.S. Cl.
CPC ....... *B60L 11/1803* (2013.01); *B60L 11/1809* (2013.01); *B60L 11/1812* (2013.01);
(Continued)

(58) Field of Classification Search
CPC .............. B60L 11/1803; B60L 11/1809; B60L 11/1877; B60L 11/1816; B60L 11/1812;
(Continued)

(56) References Cited

U.S. PATENT DOCUMENTS 6,984,783 B2    1/2006  Kusumi et al.
8,912,443 B2 *  12/2014 Akahori ................. H01R 9/226
                                                    174/59

(Continued)

FOREIGN PATENT DOCUMENTS

CN      101552442 A       10/2009
JP      11121690 A   *    4/1999
(Continued)

OTHER PUBLICATIONS

English abstract of CN 101552442 A; Toshinori Iwai, Oct. 2009.*
(Continued)

*Primary Examiner* — Jared Fureman
*Assistant Examiner* — Michael J Warmflash

(57) ABSTRACT

A power conversion apparatus capable of cheaply securing safety and achieving watertightness. The power conversion apparatus (100) has: a charging device (14) for charging from an external power source (20) to a cell (30); an inverter (13) for converting the current of the cell (30) from direct current to alternating current and supplying the current to a motor (40); and a junction box (15) for relaying an electrical connection. The inverter (13), the charging device (14), and the junction box (15) are contained in a single housing. Also, the charging device (14) and the junction box (15) are electrically connected, and the junction box (15) and the (Continued)

inverter (13) are electrically connected. Also, the junction box (15) and the inverter (13) are connected by a bus bar (16).

14 Claims, 12 Drawing Sheets

(51) Int. Cl.
*H05K 7/14* (2006.01)
*H02G 3/08* (2006.01)

(52) U.S. Cl.
CPC ....... *B60L 11/1816* (2013.01); *B60L 11/1877* (2013.01); *H02M 7/44* (2013.01); *H05K 7/1432* (2013.01); *H02G 3/088* (2013.01); *Y02T 10/7005* (2013.01); *Y02T 10/705* (2013.01); *Y02T 10/7072* (2013.01); *Y02T 90/127* (2013.01); *Y02T 90/14* (2013.01)

(58) Field of Classification Search
CPC .... H02M 7/44; H05K 7/1432; Y02T 10/7072; Y02T 90/127; Y02T 90/14; Y02T 10/705; Y02T 10/7005; H02G 3/088
See application file for complete search history.

(56) References Cited

U.S. PATENT DOCUMENTS

| | | | |
|---|---|---|---|
| 9,444,082 B2* | 9/2016 | Tsujimura | H01M 2/1077 |
| 9,487,163 B2* | 11/2016 | Matano | B60K 1/04 |
| 2003/0034693 A1 | 2/2003 | Wareham et al. | |
| 2003/0057705 A1 | 3/2003 | Kusumi et al. | |
| 2006/0021779 A1* | 2/2006 | Kanazawa | H02G 3/088 |
| | | | 174/67 |
| 2008/0050645 A1* | 2/2008 | Kai | B60L 11/1861 |
| | | | 429/61 |
| 2009/0250237 A1* | 10/2009 | Akahori | H01R 9/226 |
| | | | 174/68.2 |
| 2012/0153718 A1* | 6/2012 | Rawlinson | H02K 5/20 |
| | | | 307/10.1 |
| 2014/0333130 A1 | 11/2014 | Matano et al. | |
| 2015/0136504 A1* | 5/2015 | Tsujimura | H01M 2/1077 |
| | | | 180/68.5 |

FOREIGN PATENT DOCUMENTS

| | | |
|---|---|---|
| JP | H11-121690 A | 4/1999 |
| JP | 2000-253511 A | 9/2000 |
| JP | 2000-261936 A | 9/2000 |
| JP | 2003-009301 A | 1/2003 |
| JP | 2005-143200 A | 6/2005 |
| JP | 2012-240477 A | 12/2012 |
| WO | 2012/157316 | 3/2012 |

OTHER PUBLICATIONS

Extended European Search Report issued in Application No. EP 14 78 0325 dated Aug. 9, 2016.
English translation of Search Report issued in Patent Application No. CN 201480015668.1 dated Feb. 3, 2017.
International Search Report for Application No. PCT/JP2014/001859 dated Jun. 24, 2014.

* cited by examiner

POWER CONVERSION APPARATUS AND JUNCTION BOX

TECHNICAL FIELD

The present invention relates to a power conversion apparatus and a junction box to be installed in a vehicle.

BACKGROUND ART

In recent years, electric vehicles (EVs) or plug-in hybrid electric vehicles (PHEVs) have become popular. These vehicles each include: a battery; a charging apparatus configured to charge the battery using an external power supply (commercial power supply); an inverter configured to convert a direct current from the battery to an alternating-current; and a motor configured to drive a wheel of the vehicle using the alternating-current from the inverter (e.g., see Patent Literature (hereinafter, referred to as "PTL") 1. These devices are electrically connected to each other.

CITATION LIST

Patent Literature

PTL 1
Japanese Patent Application Laid-Open No. 2012-240477

SUMMARY OF INVENTION

Technical Problem

The technique disclosed in PTL 1 adopts a harness as a means for electrical connection, thus connecting devices respectively housed in different casings to each other via a harness. Accordingly, the technique disclosed in PTL 1 has the following problems.

More specifically, the harness is exposed to the outside of each casing, so that processing to coat the harness with an insulator and/or waterproofing needs to be applied to the harness in order to ensure safety. Such processing requires costs.

Moreover, use of a harness requires custom processing for a connection portion of the harness in each connection-target device. Such processing requires costs as well.

An object of the present invention is to ensure safety as well as to achieve complete waterproofing without additional costs.

Solution to Problem

A power conversion apparatus according to an aspect of the present invention includes: a charging apparatus that charges a battery using an external power supply; an inverter that converts a current of the battery from a direct current to an alternating-current and that supplies the alternating-current to a motor; and a junction box that relays electrical connection, in which the inverter, the charging apparatus, and the junction box are housed in a single casing, and the charging apparatus and the junction box are electrically connected to each other while the junction box and the inverter are electrically connected to each other, in which the junction box and the inverter are connected to each other via a bus bar.

A junction box according to an aspect of the present invention includes a protruding portion to be inserted into an opening formed in a partition member of a casing that is internally divided into a plurality of spaces by the partition member, in which the protruding portion includes an insulation portion and serves as a connection portion for a bus bar.

Advantageous Effects of Invention

According to the present invention, it is made possible to ensure safety as well as to achieve complete waterproofing without additional costs.

DESCRIPTION OF EMBODIMENTS

Embodiment 1

Hereinafter, a description will be given of a power conversion apparatus according to Embodiment 1 of the present invention with reference to the accompanying drawings.

Figure 1:
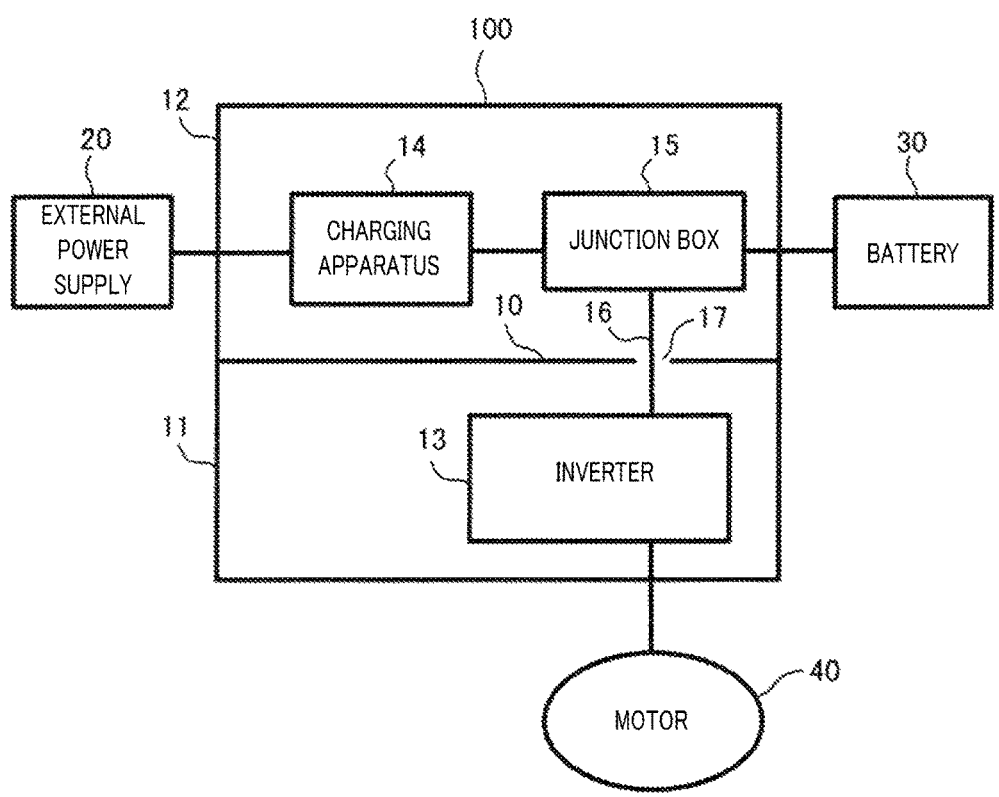
FIG. 1 is a block diagram illustrating an example of a power conversion apparatus according to Embodiment 1 of the present invention.

FIG. 1 is a block diagram illustrating a configuration example of the power conversion apparatus according to Embodiment 1.

In FIG. 1, power conversion apparatus 100 is an apparatus to be installed in a vehicle such as an EV and includes: casings 11 and 12; inverter 13, which serves as a power conversion circuit; charging apparatus 14; and junction box 15. In power conversion apparatus 100, a single casing is formed by combination of casing 11 (an example of a first casing) and casing 12 (an example of a second casing) and is divided into casings 11 and 12 by partition member 10. Partition member 10 is a member serving as the bottom of casing 12 (hereinafter, may be referred to as "bottom member").

Casings 11 and 12 are molded using an aluminum cast, for example, and are heat-resistant and rigid. Casings 11 and 12 are ensured for airtightness in order to prevent entry of a water droplet or dust or the like into casing 11 and 12, respectively.

Casing 11 includes inverter 13 in an inner portion (an example of a first space) of casing 11. Inverter 13 converts a direct current (or DC-power) supplied from battery 30 to a three-phase alternating-current (or AC power) and outputs the current to motor 40.

Meanwhile, casing 12 includes charging apparatus 14 and junction box 15 in an inner portion (an example of a second space) of casing 12. Charging apparatus 14 includes an AC-DC conversion circuit and/or a DC-DC conversion circuit and receives power from external power supply 20 and generates a charging voltage for battery 30. Junction box 15 is an apparatus configured to relay electrical connection between battery 30, charging apparatus 14, and inverter 13 and also to distribute the flow of power, and is called an electricity distribution box.

Charging apparatus 14 is electrically connected to external power supply (commercial power supply) 20 via an external connector (not illustrated) and electrically connected to junction box 15. For example, charging apparatus 14 and junction box 15 are connected via a bus bar.

Junction box 15 is connected to battery 30 via a harness, for example. Thus, charging apparatus 14 converts power from external power supply 20 into a direct current from an alternating-current, and charges, via junction box 15, battery 30, which is installed in the vehicle. Battery 30 is a secondary battery configured to store power for driving motor 40.

Inverter 13 is electrically connected to motor 40 and is also electrically connected to junction box 15. Inverter 13 and junction box 15 are connected to each other via bus bar 16. Bus bar 16 is made of metal (e.g., made of copper) and has the positive pole and negative pole. Bus bar 16 passes through opening 17, which is formed in partition member 10, and connects inverter 13 and junction box 15 together. Thus, inverter 13 converts a current supplied from battery 30 via junction box 15 to an alternating-current (e.g., three-phase alternating-current) and supplies the current to motor 40, which is mounted in a vehicle. Motor 40 drives a wheel of the vehicle using the alternating-current.

Figure 2:
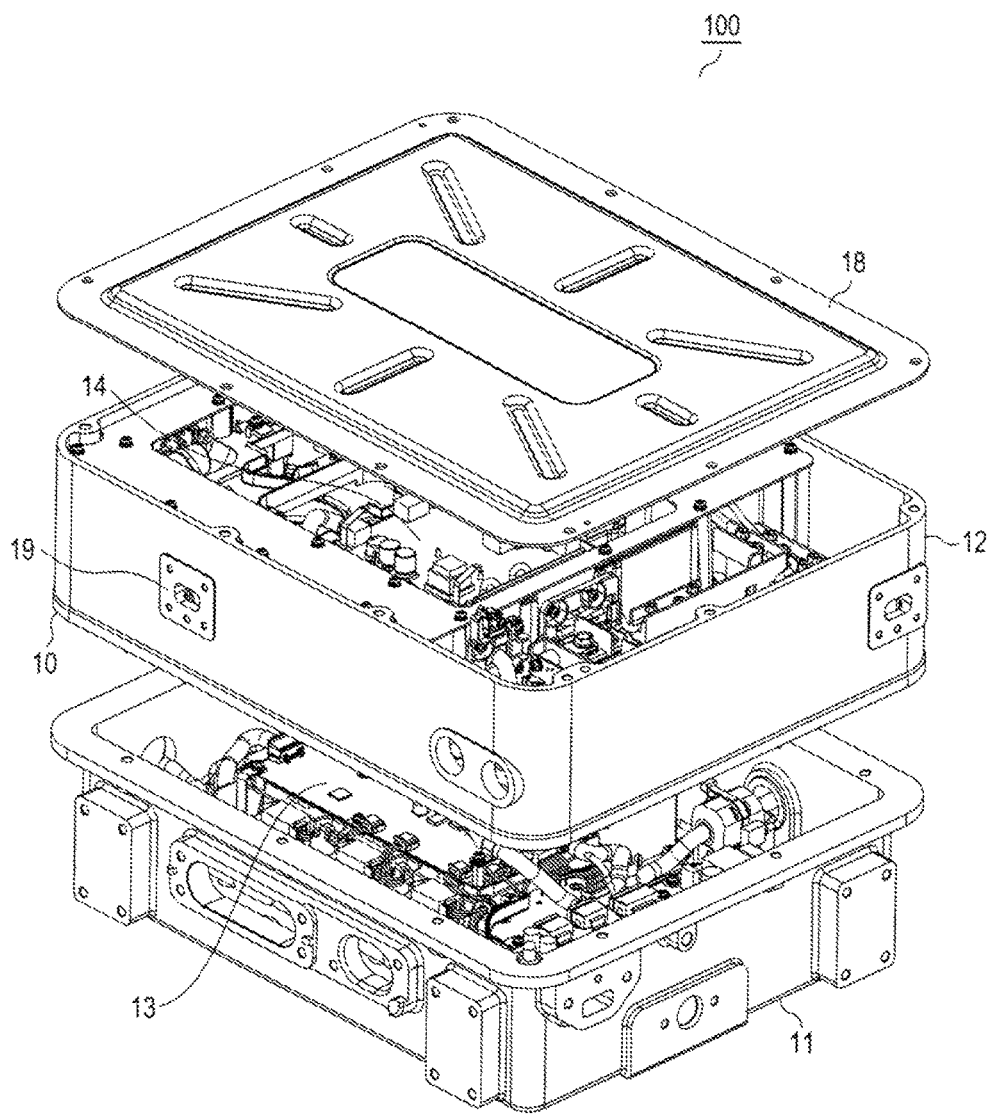
FIG. 2 is an exploded perspective view illustrating an example of the power conversion apparatus according to Embodiment 1 of the present invention.

FIG. 2 is an exploded perspective view illustrating a configuration example of the power conversion apparatus according to Embodiment 1.

In FIG. 2, power conversion apparatus 100 is separated into casings 11 and 12, and lid 18. Casings 11 and 12, and lid 18 are each made of metal.

Casings 11 and 12 each substantially has an open-top cuboid shape. Casing 12 is superimposed on and fastened with casing 11. Bottom member 10 of casing 12 serves as a lid portion of casing 11 when superimposed on chasing 11. Meanwhile, the opening of casing 12 is covered by lid 18. Note that, how casings 11 and 12 are fastened together will be described using FIG. 3, hereinafter.

In FIG. 2, external power supply connection portion 19, which is disposed on a side surface of casing 12, serves as an interface for connection with external power supply 20. In addition, casing 12 includes a battery connection portion (not illustrated), which serves as an interface for connection with battery 30, and which is disposed on a side surface opposite to the side surface where external power supply connection portion 19 is disposed. Moreover, a motor connection portion (not illustrated), which serves as an interface for connection with motor 40 is disposed on the bottom of casing 11.

In FIG. 2, casing 12 includes one interlock (not illustrated). This interlock detects that lid 18 has been opened (open state of lid 18). With this detection, the current in power conversion apparatus 100 is controlled to stop. Although it will be described hereinafter, a fastening portion for fastening casings 11 and 12 is disposed within each casing. Accordingly, the user always needs to remove lid 18 of casing 12 in order for the user to touch the inside of casing 11. This configuration eliminates the need for an interlock to detect an opening state of the lid in casing 11. Stated differently, the interlock of casing 12 also serves as the interlock for casing 11.

Figure 3:
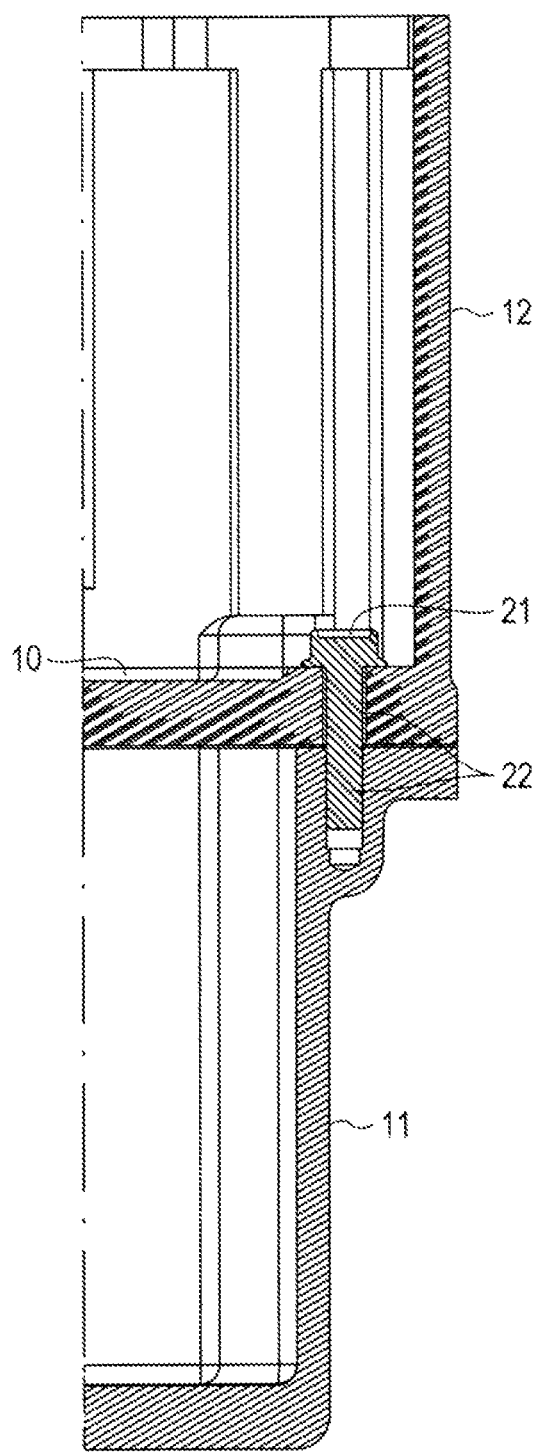
FIG. 3 is a lateral cross-sectional view illustrating an example of the vicinity of a fastening portion of the power conversion apparatus according to Embodiment 1 of the present invention.

FIG. 3 is a lateral cross-sectional view illustrating a configuration example of the fastening portion of power conversion apparatus 100 according to Embodiment 1.

The fastening portion for fastening casings 11 and 12 is disposed inside casings 11 and 12. In FIG. 3, the fastening portion is formed of screw 21 and screw hole 22, for example. Screw hole 22 is formed in each of casings 11 and 12. When casing 11 is appropriately superimposed on casing 12, single screw hole 22, which is a through hole, is formed. Casings 11 and 12 are fastened together by inserting screw 21 into screw hole 22. Note that, although only one position of the fastening portion is illustrated in FIG. 3, it is preferred that a plurality of fastening portions identical to the fastening portion mentioned above be disposed inside of each casing.

Figure 4:
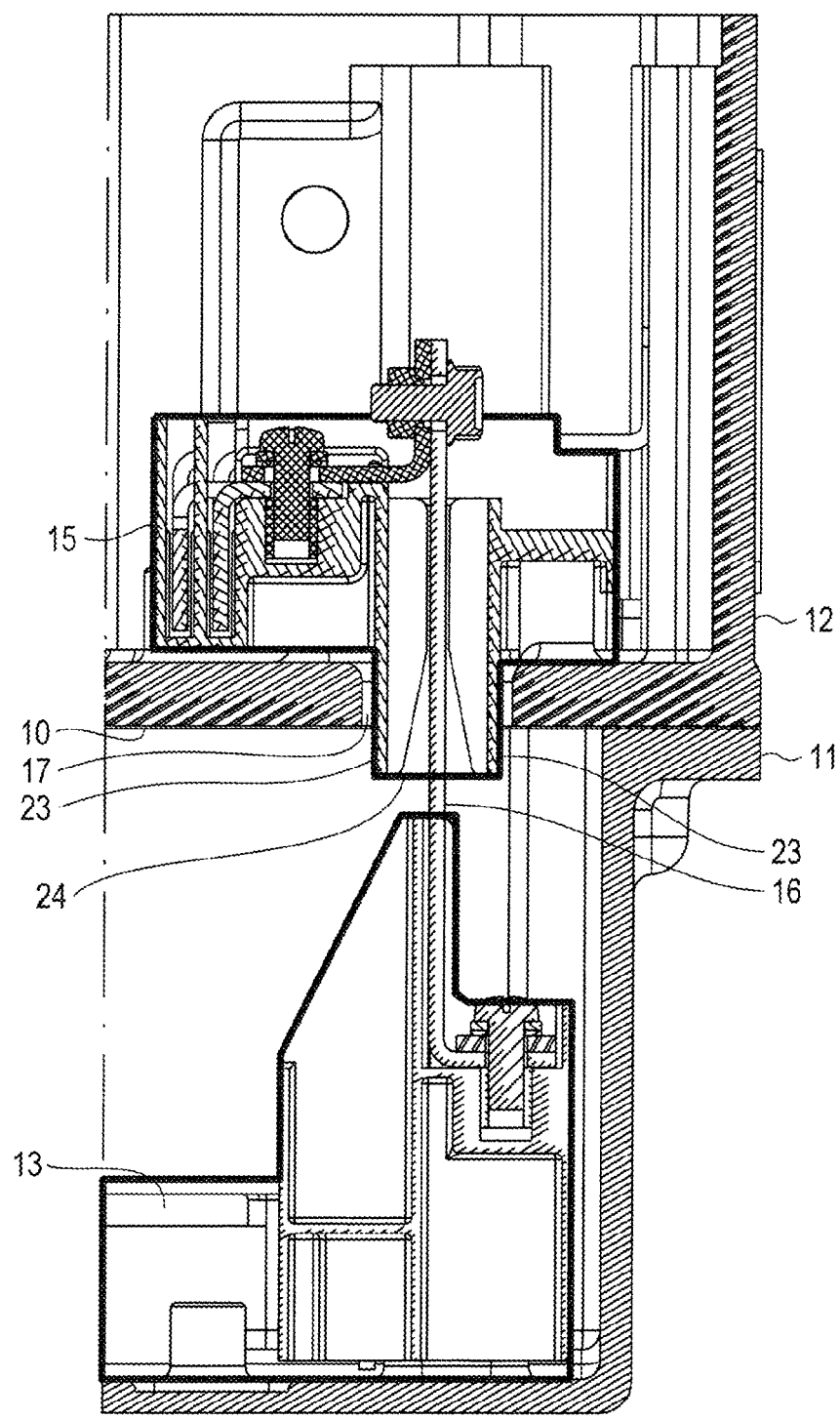
FIG. 4 is a lateral cross-sectional view illustrating an example of the vicinity of a bus bar according to Embodiment 1 of the present invention.

FIG. 4 is a lateral cross-sectional view illustrating a configuration example for a position around the bus bar of power conversion apparatus 100 according to Embodiment 1. Note that, illustration of the fastening portion (screw 21 and screw hole 22) illustrated in FIG. 3 is omitted in FIG. 4.

In FIG. 4, junction box 15 is formed in a partially protruding shape. The partially protruding portion of junction box 15 is referred to as protruding portion 24 and is inserted into opening 17 and serves as a connection portion (insertion port) for bus bar 16. Protruding portion 24 includes a portion near the opening which is formed as insulation portion 23. Furthermore, as described above, bus bar 16 passes through opening 17 and connects inverter 13 and junction box 15 together.

Figure 5A:
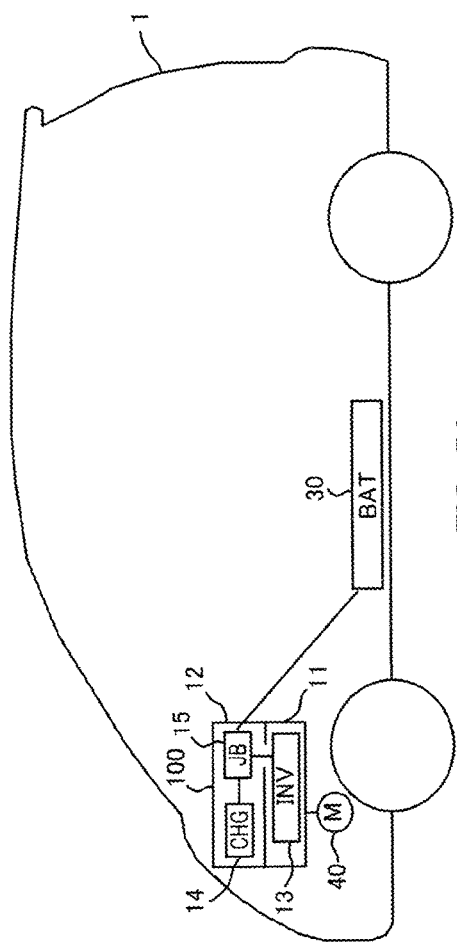
FIGS. 5A and 5B are each a lateral cross-sectional view illustrating an example of a vehicle installation position for the power conversion apparatus according to Embodiment 1 of the present invention.
Figure 5B:
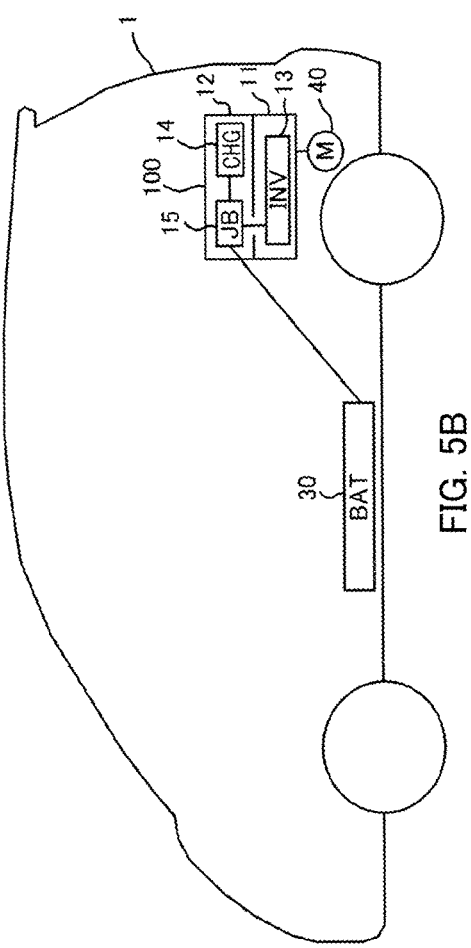

FIGS. 5A and 5B are each a lateral cross-sectional view illustrating an example of an in-vehicle installation position of power conversion apparatus 100 according to Embodiment 1. Hereinafter, two examples illustrated in FIGS. 5A and 5B will be described, respectively. Note that, the charging apparatus, junction box, inverter, motor, and battery are denoted by "CHG," "JB," "INV," "M," and "BAT," respectively, in FIGS. 5A and 5B.

FIG. 5A illustrates an example in which power conversion apparatus 100 is installed in a front portion of vehicle 1. In FIG. 5A, battery 30 is installed in a bottom portion (e.g., under the passenger seat) of vehicle 1. Junction box 15 is installed at a position that allows junction box 15 to be connected to battery 30 with the shortest distance in casing 12. As described above, junction box 15 and battery 30 are connected together via a harness.

FIG. 5B illustrates an example in which power conversion apparatus 100 is installed in a rear portion of vehicle 1. In FIG. 5B, battery 30 is installed in a bottom portion (e.g., under the passenger seat) of vehicle 1. Junction box 15 is installed at a position that allows junction box 15 to be connected to battery 30 with the shortest distance in casing 12. As described above, junction box 15 and battery 30 are connected together via a harness.

Power conversion apparatus 100 according to Embodiment 1 described above can bring about the following effects.

Power conversion apparatus 100 according to Embodiment 1 is characterized in that inverter 13, charging apparatus 14, and junction box 15 are housed in a single casing, and charging apparatus 14 and junction box 15 are electrically connected to each other while junction box 15 and inverter 13 are electrically connected to each other, and junction box 15 and inverter 13 are connected to each other via bus bar 16. More specifically, in power conversion apparatus 100 according to Embodiment 1, a charging apparatus, a junction box, and an inverter are electrically connected to each other in a single casing, so that the casing itself can serve as a cover for the electrically connected portions between these devices. In addition, the electrical connection according to Embodiment 1 allows the charging apparatus, the junction box and the inverter to be disposed while being fixed at certain positions within a limited space inside the casing. For this reason, there is no need to use a harness. Accordingly, power conversion apparatus 100 according to Embodiment 1 can ensure safety and achieve complete waterproofing without additional costs.

In addition, power conversion apparatus 100 according to Embodiment 1 is characterized in that power conversion apparatus 100 includes a single casing in which two spaces obtained by dividing the space inside the casing using partition member 10, while inverter 13 and junction box 15 are placed in the two different spaces, respectively, but connected to each other via bus bar 16 passing through opening 17, which is formed in portion member 10. More specifically, in power conversion apparatus 100 according to Embodiment 1, an inverter and a junction box are electrically connected to each other within a single casing, so that the casing itself can serve as a cover for the electrical connection portion of the two devices. In addition, the electrical connection according to Embodiment 1 requires no use of a harness because the charging apparatus, the junction box and the inverter are fixed at certain positions within the limited space, which is the space inside the casing. Accordingly, power conversion apparatus 100 according to Embodiment 1 can ensure safety and achieve complete waterproofing without additional costs.

Power conversion apparatus 100 according to Embodiment 1 is characterized in that battery 30 is installed in a rear portion or a bottom portion of vehicle 1 while junction box 15 is installed at a position that makes the distance between junction box 15 and the battery shortest within power conversion apparatus 100. Thus, power conversion apparatus 100 according to Embodiment 1 can reduce the length of the harness connecting the junction box and the battery together, thus reducing the costs. Note that, higher safety can be achieved in the arrangement illustrated in FIG. 5B than in the arrangement in FIG. 5A. More specifically, in FIG. 5A, it is possible for the user to touch power conversion apparatus 100 when the hood is open, so that this arrangement is not very safe. Meanwhile, in FIG. 5B, the user cannot touch power conversion apparatus 10 disposed inside the trunk, even when a rear door is open, so that this arrangement is safe.

Moreover, in power conversion apparatus 100 according to Embodiment 1, protruding portion 24, which is a part of junction box 15, includes insulation portion 23 and is inserted through opening 17 and serves as a connection portion for bus bar 16. Thus, power conversion apparatus 100 according to Embodiment 1 can avoid an unsafe situation that may occur when the bus bar comes into contact with a metal-made opening because the screw of the fastening portion comes loose, for example.

Moreover, power conversion apparatus 100 according to Embodiment 1 is characterized in that a single casing is divided into the first and the second spaces using partition member 10, while casing 11, which forms the first space, and casing 12, which forms the second space, are separable, and that casings 11 and 12 include fastening portions for fastening casings 11 and 12 together in the first and the second spaces, respectively. Stated differently, the fastening portions are included inside the respective casings. Thus, power conversion apparatus 100 according to Embodiment 1 can be reduced in length of the lateral width of the entire casing by the length (width) of the fastening portions, which would otherwise be added to the lateral width of the entire casing when the fastening portions are formed outside the respective casings.

Moreover, power conversion apparatus 100 according to Embodiment 1 is characterized in that casing 12 is superimposed on and fastened to the casing 11 inside casings 11 and 12, while power conversion apparatus 100 according to Embodiment 1 includes, in casing 12, only one interlock to detect an open state of lid 18 of casing 12. Thus, power conversion apparatus 100 according to Embodiment 1 does not need to include an interlock in casing 11, thereby making it possible to obtain effects including simplification in shape, a cost reduction for the interlock itself, and a reduction in the number of components required for installation of the interlock, for example.

Junction box 15 according Embodiment 1 is characterized by including protruding portion 24 to be inserted into opening 17, while protruding portion 24 includes insulation portion 23 and serves as a connection portion for bus bar 16. Thus, the junction box according to Embodiment 1 makes it possible to avoid an unsafe situation that may occur when the bus bar comes into contact with the metal-made opening portion because the screw of the fastening portion comes loose, for example.

The description has been given of Embodiment 1 of the present invention, but the description is an example only, and the following modifications are possible, for example.

For example, an example is used to describe Embodiment 1, in which junction box 15 is included in casing 12 together with charging apparatus 14, but the present invention is not limited to this example. For example, junction box 15 may be included in casing 11 together with inverter 13.

For example, an example is used to describe Embodiment 1, in which an unsafe situation that may occur when bus bar 16 comes into contact with opening 17 is avoided by including insulation portion 23 in protruding portion 24 of junction box 15, but the present invention is not limited to this example. For example, junction box 15 itself may be formed using an insulator (e.g., resin), or the portion of partition member 10 where opening 17 is formed may be coated using an insulating member. Thus, as in the case of the presence of insulation portion 23 of protruding portion 24, it is made possible to avoid an unsafe situation that may occur when bus bar 16 comes into contact with opening portion 17 because screw 21 comes loose, for example.

Furthermore, a configuration is used to describe Embodiment 1, in which battery 30 is installed in a bottom portion of vehicle 1, but the present invention is not limited to this configuration. For example, battery 30 may be installed in a front portion or rear portion of the vehicle. In this configuration, junction box 15 is installed at a position that makes the distance between junction box 15 and battery 30 shortest in casing 12.

Furthermore, although a configuration in which inverter 13, charging apparatus 14, and junction box 15 are housed in power conversion apparatus 100 in Embodiment 1, for example, the present invention is not limited to this configuration, and another device may be installed in power conversion apparatus 100. For example, a DC/DC converter may be housed in power conversion apparatus 100. Such a DC/DC converter is used to supply power to an auxiliary battery (12V), for example, and reduces a high voltage of battery 30 to 12V and outputs the power. Housing the DC/DC converter within power conversion apparatus 100 (e.g., within casing 12) increases the number of high voltage cables covered by power conversion apparatus 100, thereby making it possible to further enhance the safety.

In Embodiment 1, a description has been given of a configuration in which power conversion apparatus 100 includes a single casing formed by combination of casings 11 and 12 while partition member 10 serves as a bottom member for casing 12, but the present invention is not limited to this configuration. For example, a single casing without combination of a plurality of casings (single casing that cannot be separated into a plurality of casings) may be employed. Moreover, partition member 10 may be a member that simply divides a space. Note that, the number of partition members 10 is not limited to one, and may be two or more.

Embodiment 2

Hereinafter, a description will be given of a power conversion apparatus according to Embodiment 2 of the present invention with reference to the accompanying drawings.

Background and Problems According to Embodiment 2

In recent years, vehicles provided with a running motor, such as hybrid electric vehicles (HEVs), plug-in HEVs (PHEVs), or electric vehicles (EVs) have become popular. These vehicles may be provided with a high-output motor such as a motor for driving a lifting machine, a crane, or a power compressor.

These vehicles are provided with a power conversion apparatus configured to convert power between an external power supply, a storage battery, and a motor, in addition to a storage battery for supplying power. Such a power conversion apparatus is provided with a charging circuit that generates a charging voltage for the storage battery from the external power supply or an inverter circuit that converts a direct current of the storage battery to a three-phase alternating-current and outputs the current to the motor, for example.

The power conversion apparatus includes a power conversion circuit to which a high voltage is applied or in which a high voltage is generated, so that it is a common practice to configure the power conversion circuit to be covered by a casing (see, e.g., Japanese Patent Applications Laid-open No. 2003-009301 and No. 2005-143200). The casing is ensured for airtightness in order to prevent entry of a water drop or dust, for example.

During a vehicle assembly process, a process of assembling a power conversion apparatus of a production unit to a vehicle may include a step of connecting a power output cable (e.g., output cable for supplying a driving current to a motor) to the power conversion apparatus. A cable through which a large current flows requires sure connection. For this reason, as a connection method for such a cable, a connection method of inserting a cable into a casing of a power conversion apparatus and directly connecting the cable to a connection portion is employed, normally, instead of a connection method using a connector. Connecting a cable to the connection portion is performed by inserting a screw driver or the like through a work window of the casing.

The connection portion is provided at a plurality of positions, e.g., three connection portions where three-phase alternating-current is outputted. The plurality of connection portions are disposed while being spaced apart from each other in general in consideration of securing a predetermined insulation distance or of the influence of a magnetic field. For this reason, the work window for a plurality of connection portions is formed as a window hole that is long in a direction where the connection portions are aligned or a plurality of window holes aligned in a direction identical to that of the plurality of connection portions.

When the casing of the power conversion apparatus is provided with a work window, an interlock mechanism is required, which ensures safety when the work window is opened. To be more specific, such an interlock mechanism is a mechanism in which an interlock switch turns and blocks supply of power when the lid of the work window is removed.

However, when the work window is formed in a range that is long in a certain direction, there arises a problem of how a lid partially forming the interlock mechanism should be formed.

For example, when a configuration is employed in which a metal lid is adopted and fastened to the casing via a gasket, high airtightness can be ensured. However, providing the lid with a mechanism (e.g., protrusion) to turn an interlock switch makes molding difficult compared with the case where the lid is made of resin, and causes an increase in the number of manufacturing steps, thus causing an increase in costs.

Meanwhile, when a configuration is employed in which a resin-made lid including an O-ring is fastened to the casing, the mechanism (e.g., protrusion) to turn an interlock switch can be formed in the lid with low costs and a high degree of freedom by resin molding. For example, a protrusion having an optimum shape can be easily formed in the lid. However, when a lid that is long in a certain direction such as a rectangular shape is to be sealed, an O-ring having a similar shape needs to be prepared. In this case, there arises a problem in that it is difficult to keep the airtightness by the O-ring as the length of the certain direction becomes long.

Moreover, when a plurality of sets of work windows and lids are to be independently provided for a plurality of connection portions, there arises a problem in that it is required to prepare the number of interlock mechanisms for the number of lids.

For the reasons mentioned above, in Embodiment 2, it is made possible to ensure airtightness for a work window of a power conversion apparatus and to achieve easiness of the manufacturing of an interlock mechanism.

Description of Embodiment 2

The basic configuration of power conversion apparatus 100 according to Embodiment 2 is similar to the configuration illustrated in FIG. 1, so that the description will not be repeated. Hereinafter, a description will be given of differences from Embodiment 1.

[Configuration of Work Window]

Figure 6:
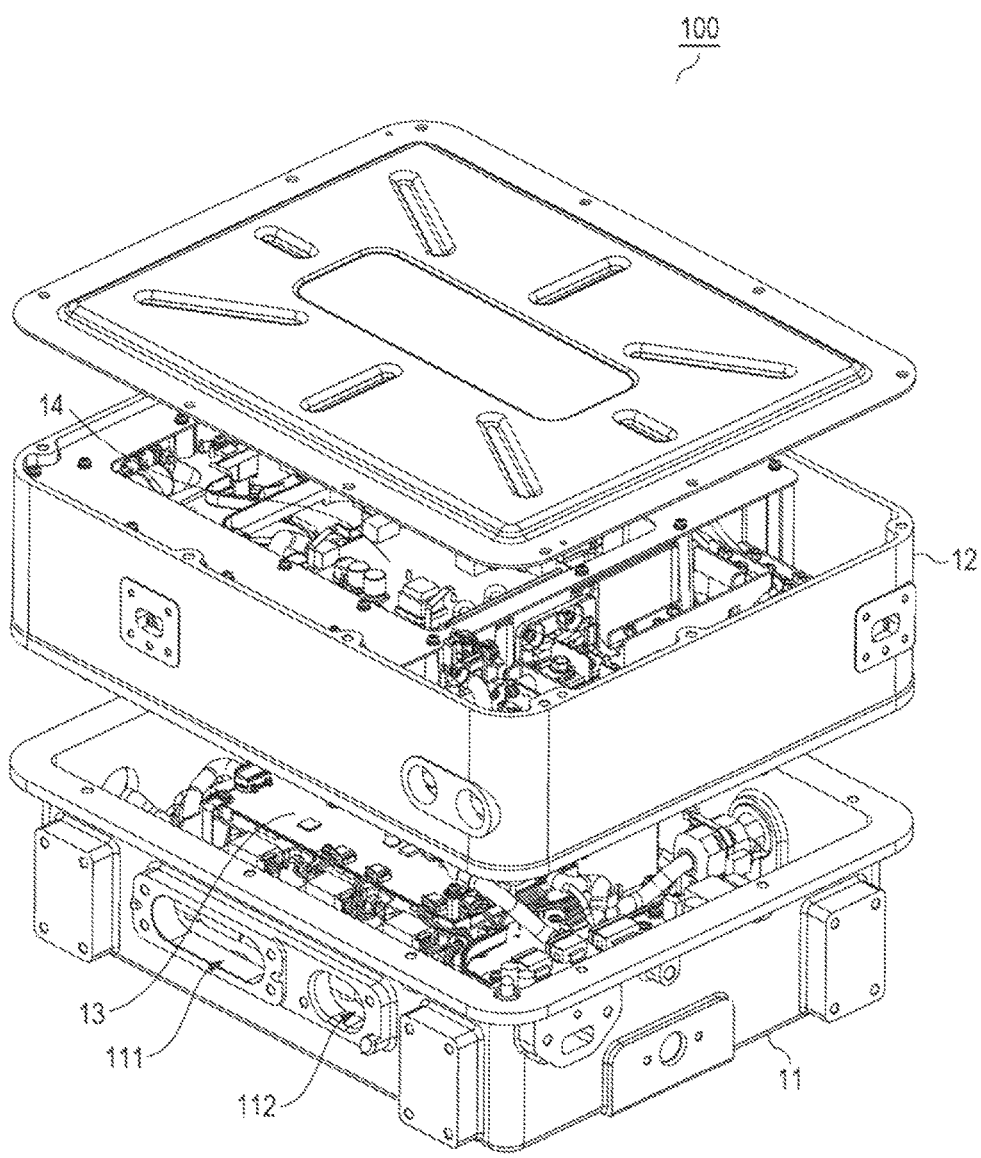
FIG. 6 is an exploded perspective view illustrating an example of a power conversion apparatus according to Embodiment 2 of the present invention.

In power conversion apparatus 100 according to Embodiment 2, casing 11 includes two work windows 111 and 112 for directly connecting three-phase output cables 42 to inverter 13 as illustrated in FIG. 6.

Figure 7:
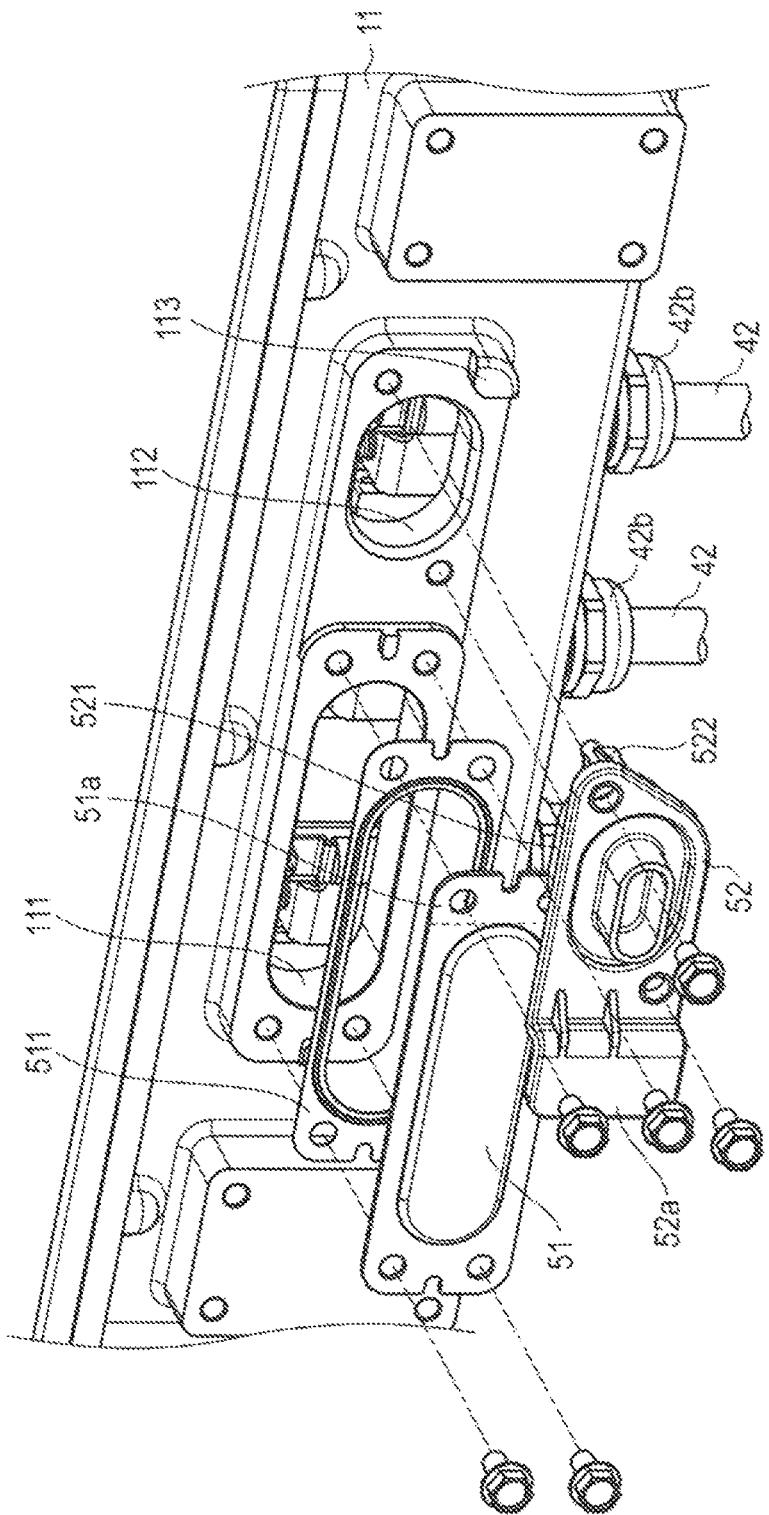
FIG. 7 is an exploded perspective view illustrating an example of the structures of work windows and lids of the power conversion apparatus according to Embodiment 2 of the present invention.
Figure 8:
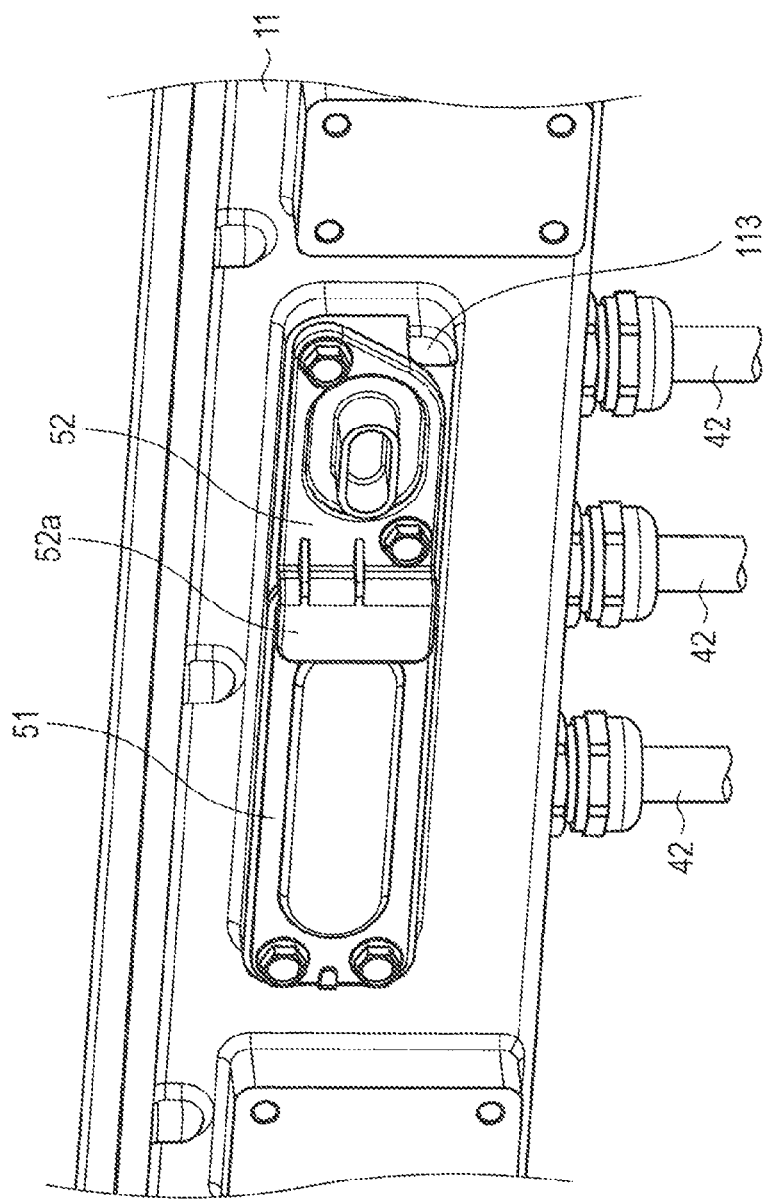
FIG. 8 is a perspective view illustrating an example of how the lids are fixed to the work windows of the power conversion apparatus according to Embodiment 2 of the present invention.
Figure 9:
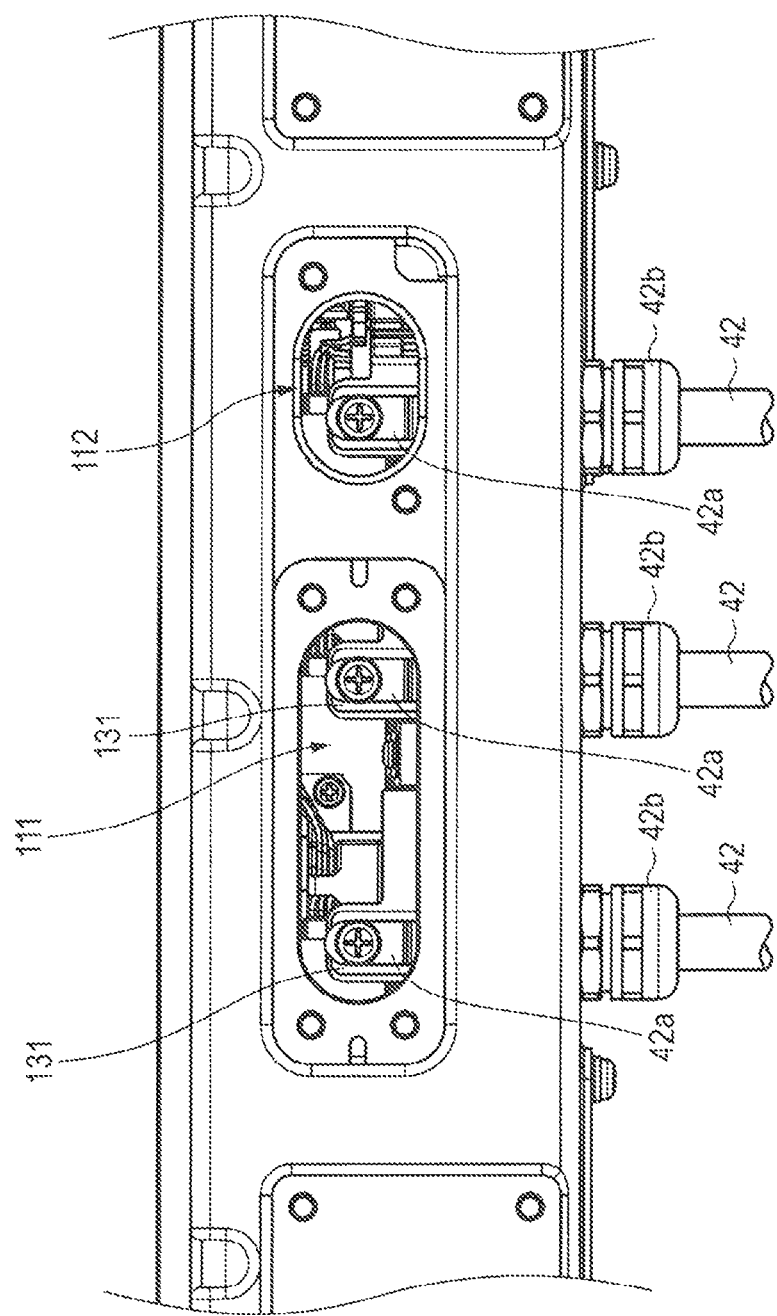
FIG. 9 is a front view illustrating an example of the work windows of the power conversion apparatus according to Embodiment 2 of the present invention.
Figure 10:
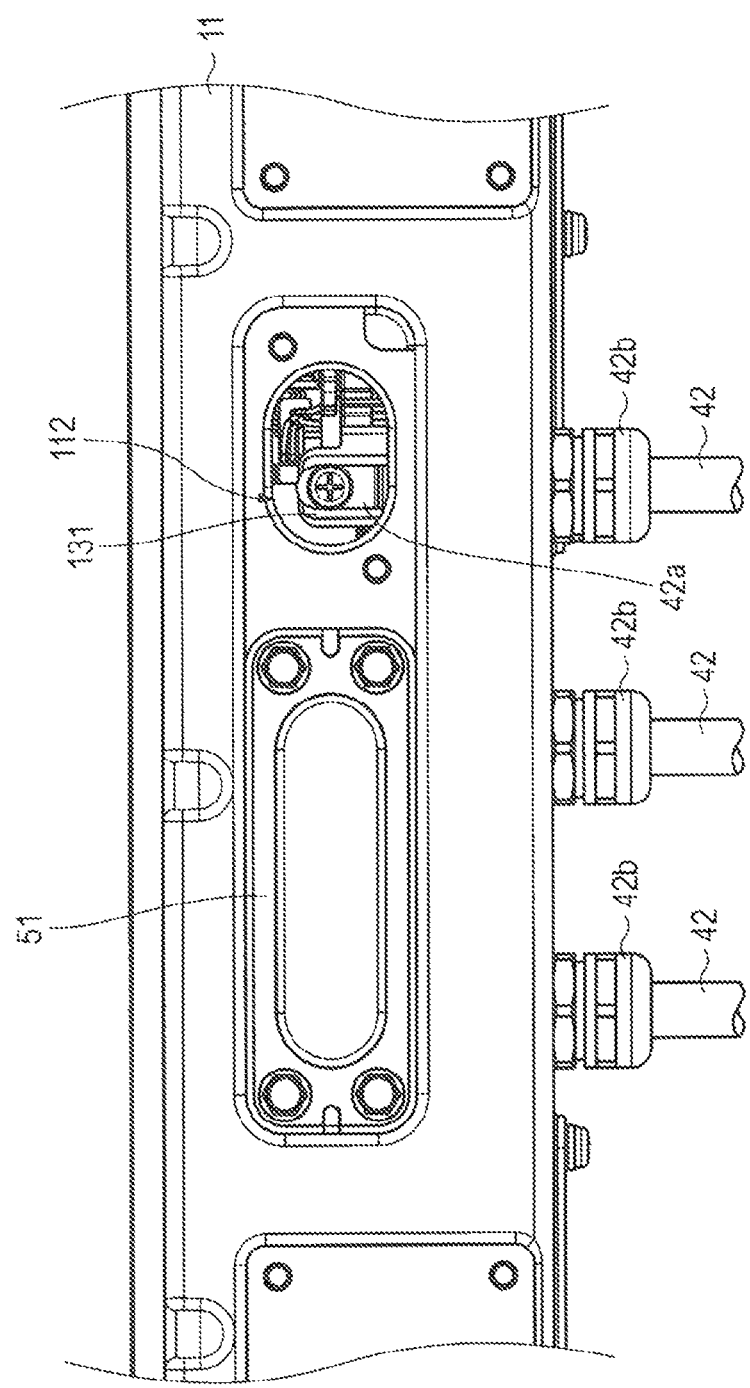
FIG. 10 is a front view illustrating an example of how a first lid is fixed to the work window of the power conversion apparatus according to Embodiment 2 of the present invention.
Figure 11:
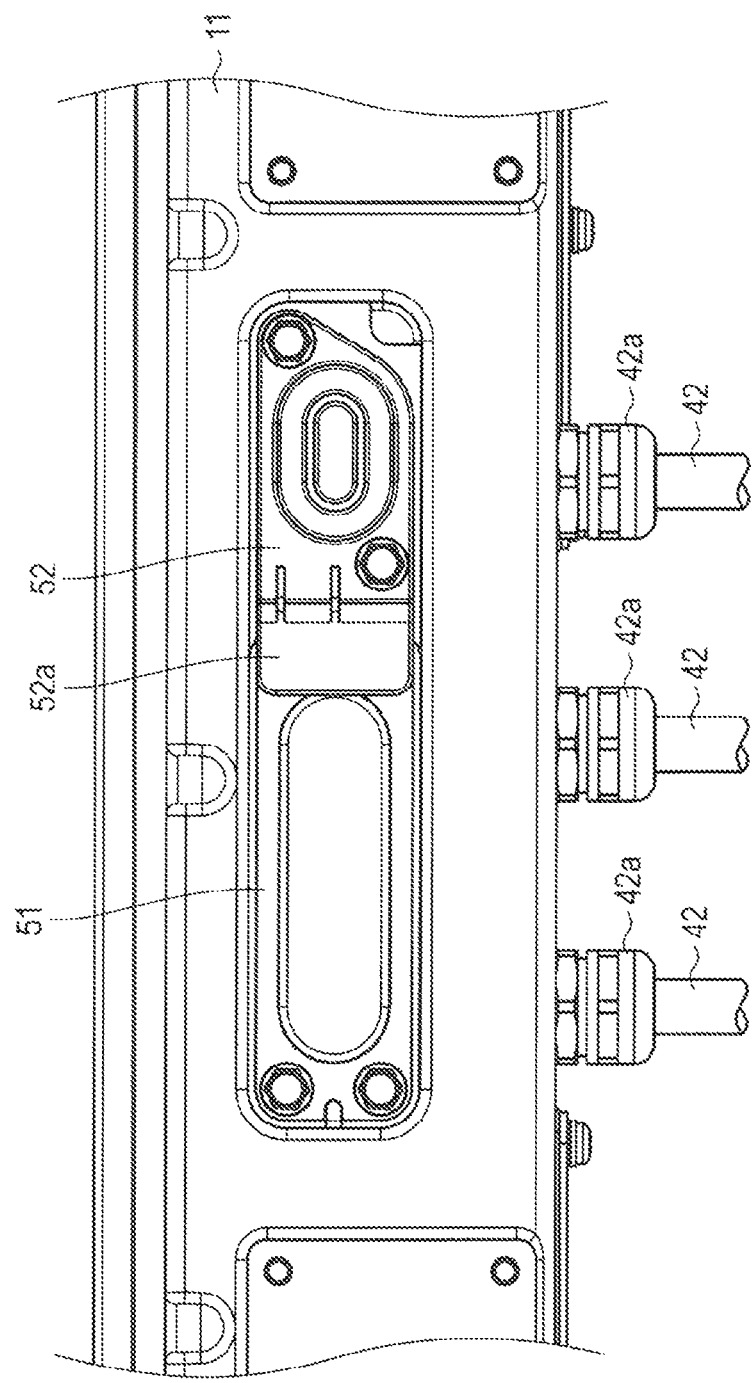
FIG. 11 is a front view illustrating an example of how the first lid and a second lid are fixed to the work windows of the power conversion apparatus according to Embodiment 2 of the present invention.

FIG. 7 is an exploded perspective view illustrating a structure of the work windows and lids of the power conversion apparatus according to Embodiment 2. FIG. 8 is a perspective view illustrating how the lids are fixed to the work windows. FIG. 9 is a front view illustrating the work windows. FIG. 10 is a front view illustrating how a first lid is fixed to a work window. FIG. 11 is a front view illustrating first and second lids are fixed to the work windows.

As illustrated in FIG. 9, work windows 111 and 112 are through holes passing through casing 11 from outside of casing 11 to inside thereof. Work windows 111 and 112 are formed at positions where three connection portions 131 face work windows 111 and 112. Three connection portions 131 are regions where connection terminals 42a of three output cables 42 for transmitting a three-phase alternating-current to motor 40 and the output terminals of inverter 13 are fixedly attached together using screws, for example.

Three connection portions 131 are disposed while being spaced apart from each other because of the magnetic influence and a need to secure a predetermined insulation distance. Three connection portions 131 are aligned in a row in parallel with a substrate of inverter 13.

Three output cables 42 are inserted into the inside of casing 11 via three through holes at a lower portion of casing 11, respectively. The airtightness for the three through holes is secured by fastening three cable clamps 42b.

Work window 111, which is one of the two work windows (hereinafter, may be referred to as "first work window 111") has an elongated hole shape that is long in a certain direction. More specifically, work window 111 has a rectangular shape that is long in the direction in which three connection portions 131 are aligned (rectangular with rounded corners). Two connection portions 131 face work window 111.

The other one of the work windows, which is work window 112 (hereinafter, may be referred to as "second work window 112") is a hole having substantially the same vertical and horizontal lengths. More specifically, work window 112 has substantially a circular shape, or an ellipse shape which has a slightly long side in a certain direction than in the other direction. One connection portion 131 faces work window 112.

[Configuration of Lid of Work Window]

As illustrated in FIG. 7, casing 11 includes a plurality of lids 51 and 52 for closing work windows 111 and 112, respectively.

First lid 51 is provided for closing first work window 111 and is a metal lid formed by processing a plate. Lid 51 is fastened to casing 11 via bolts or the like with highly rigid gasket 511 interposed therebetween. Note that, as long as the material has rigidity, lid 51 does not have to be metal.

Second lid 52 is provided for closing second work window 112 and is integrally molded using a resin. Note that, lid 52 includes projection 522 (equivalent to an operation portion), which pushes interlock switch 135 (see FIG. 12), to be described, hereinafter. Lid 52 may be formed to have both a metal portion and a resin portion by insert molding or outsert molding.

Lid 52 is fastened to casing 11 via bolts. Elastic O-ring 521 (e.g., rubber O-ring) is fitted to lid 52. O-ring 521 is placed between lid 52 and work window 112, thus sealing the gap between lid 52 and work window 112.

Lid 52 includes superimposed portion 52a, which is superimposed over one of the lids, lid 51 (hereinafter, may be referred to as "first lid 51") when lid 52, which is the other one of the lids (hereinafter, may be referred to as "second lid 52") is fastened to casing 11. Superimposed portion 52a is configured to be superimposed over fastening portion 51a of lid 51 (outside of the casing), e.g., superimposed over the bolts used for fastening lid 51. With this configuration, as illustrated in FIGS. 8 and 11, while lid 52 is fastened, bolts for first lid 51 are hidden to prevent lid 51 from being unfastened. More specifically, this structure prevents first lid 51 from being opened unless lid 52 is opened.

Projection 113 is formed near work window 112 corresponding to lid 52 so as to prevent lid 52 from being attached to the wrong side.

[Configuration of Interlock Mechanism]

Figure 12:
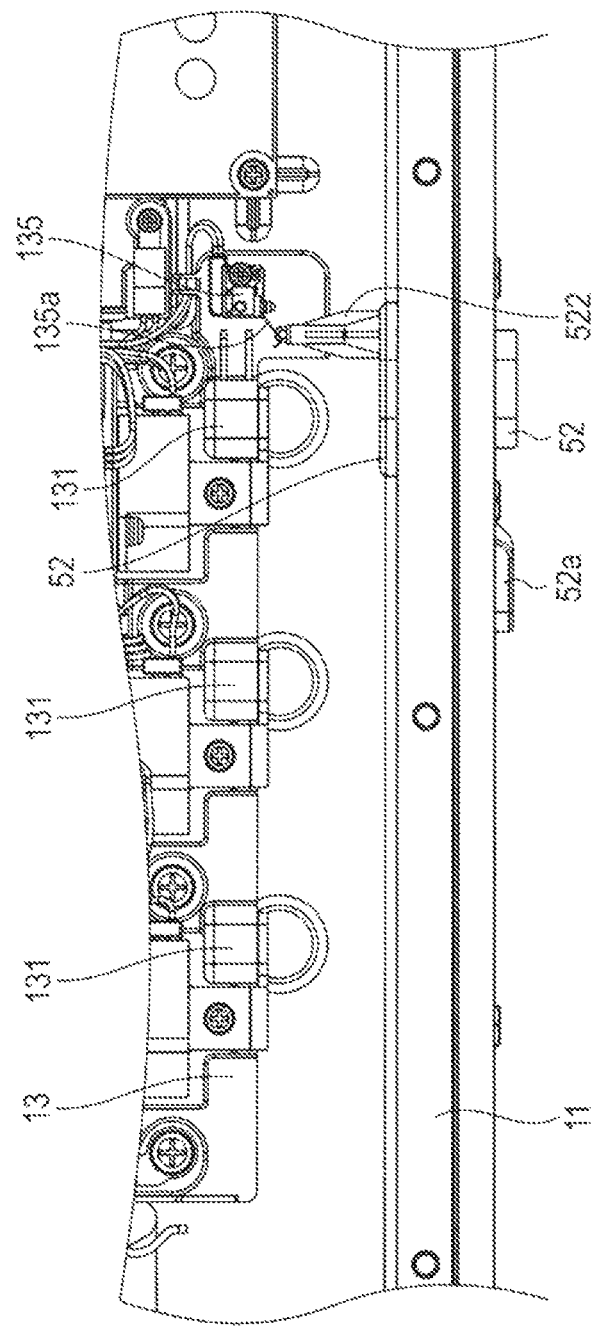
FIG. 12 is a plan view illustrating an example of an interlock mechanism of the power conversion apparatus according to Embodiment 2 of the present invention.

FIG. 12 is a plan view illustrating an interlock mechanism of the power conversion apparatus according to Embodiment 2.

Power conversion apparatus 100 according to Embodiment 2 includes an interlock mechanism for ensuring safety when work windows 111 and 112 are released.

The interlock mechanism includes: interlock switch 135, which is disposed inside casing 11; and projection 522, which responds to interlock switch 135 and turns the switch.

Interlock switch 135 is a contact switch that turns when arm 135a is pushed in, for example. Inverter 13 includes a blocking circuit that allows input of power to the inverter when arm 135a is pushed in and that blocks input of power to the inverter when arm 135a, which has been pushed in is released.

As has been described above, projection 522 is formed in lid 52 and protrudes into the inside of casing 11 from work window 112 so as to push arm 135a of interlock switch 135 while lid 52 is fastened.

Interlock switch 135 may not be a contact switch and may be a proximity sensor switch that turns the state of the switch when projection 522 comes closer to the switch.

[Installation Process to Vehicle]

As in Embodiment 1, power conversion apparatus 100 according to Embodiment 2 is installed in a vehicle. The installation of power conversion apparatus 100 will be described with reference to FIGS. 5A and 5B, hereinafter.

Vehicle 1 illustrated in FIG. 5A is an example in which running motor 40 is disposed near a front wheel axle. Battery 30 is installed in a bottom portion (e.g., under the passenger seat) of vehicle 1. In this case, it is favorable to install power conversion apparatus 100 at a front position of vehicle 1 that allows power conversion apparatus 100 to be connected to motor 40 with the shortest distance.

Vehicle 1 in FIG. 5B is an example in which running motor 40 is disposed near a rear wheel axle. Battery 30 is installed in a bottom portion (e.g., under the passenger seat) of vehicle 1. In this case, it is favorable to install power conversion apparatus 100 at a rear position of vehicle 1 that allows power conversion apparatus 100 to be connected to motor 40 with the shortest distance.

In the step of installing power conversion apparatus 100 in vehicle 100, the step of connecting output cable 42 to inverter 13 is required after installation of power conversion apparatus 100 of a unit production to vehicle 1 or during the installation.

In the step of connecting the cable, as illustrated in FIGS. 7 and 9, while lids 51 and 52 are released, the operator connects connection terminals 42a of three output cables 42 to connection portions 131 of inverter 13. Since lid 52 is removed, interlock switch 135 is turned off, thus blocking input of power to inverter 13. Accordingly, the connection work can be performed while safety is ensured.

Upon completion of the connection work, as illustrated in FIG. 10, the operator fastens first lid 51 to casing 11. Next, as illustrated in FIG. 11, second lid 52 is fastened to casing 11. Fastening the lids to casing 11 can ensure high airtightness for casing 11. Fastening second lid 52 to casing 11 turns on interlock switch 135 and enables power supply to inverter 13.

As described above, with power conversion apparatus 100 according to Embodiment 2, second lid 52 is fastened so as to partially overlap first lid 51. Accordingly, providing the interlock mechanism that interlocks with the opening and closing of second lid 52 alone makes it possible to ensure safety related to opening of work windows 111 and 112. More specifically, first lid 51 cannot be removed unless second lid 52 is removed.

Moreover, in Embodiment 2, a plurality of lids 51 and 52 are provided for closing work windows 111 and 112, respectively. Thus, even in a configuration in which work windows 111 and 112 are each formed in a range that is long in a certain direction for a plurality of connection portions disposed while being spaced apart from each other, second lid 52, which requires the operation portion (e.g., protrusion) of the interlock mechanism, can be formed in a small shape (or a shape having substantially the same vertical and lateral dimensions). Thus, use of a resin-made lid for second lid 52 allows the operation portion (e.g., projection) of the interlock mechanism to be formed easily at low costs and also makes it possible to ensure high airtightness easily with an O-ring.

In Embodiment 2, first lid 51, which requires no operation portion (e.g., projection) of the interlock mechanism, and work window 111, which corresponds to first lid 51, are formed in a shape that is long in a certain direction and placed at a position where two connection portions 131 face lid 51 and work window 111. Thus, the number of components can be reduced, and the efficiency of connection work is improved as well.

Embodiment 2 of the present invention has been described thus far, but the description provided above is only an example. Accordingly, the following modifications are possible, for example.

In Embodiment 2, the configuration in which power supply to inverter 13 is blocked when work windows 111 and 112 are opened has been described as an example of the interlock mechanism. However, the interlock mechanism may be configured to block at least application of a high voltage to connection portions 131.

In Embodiment 2, the configuration including two work windows 111 and 112, and two lids 51 and 52 has been described as an example, but a configuration including "n" work windows and "n" lids (where "n" is a natural number equal to or greater than three) may be employed. In this case, the "n" lids are each configured to partially overlap another lid and are configured in such a manner that the lids except the last lid cannot be removed unless another lid is removed.

In this configuration, the operation portion (e.g., projection) of the interlock mechanism is formed in the lid to be fastened last.

Moreover, in Embodiment 2, a configuration including two work windows 111 and 112 and two lids 51 and 52 has been described as an example, but a configuration including one work window and two lids may be employed. In this configuration, while a first lid covers the entire circumference of one work window, a through hole serving as a small work window may be formed in a part of the first lid, and a second lid is configured to cover the work window formed in the first lid.

In Embodiment 2, the configuration in which second lid 52 partially overlaps fastening portion 51a (bolts) of first lid 51 has been described as an example. However, it is also possible to employ a configuration in which second lid 52 overlaps a portion of first lid 51 other than the fastening portion of first lid 51, thereby making first lid 51 unremovable unless second lid 52 is removed. Moreover, it is also possible to employ a configuration in which first and second lids 51 and 52 are configured to be collectively fastened to casing 11 at a portion where first and second lids 51 and 52 overlap each other. For example, a configuration in which insertion holes that overlap each other are formed in first and second lids 51 and 52, respectively, and one bolt is inserted through both of the insertion holes to fasten first and second lids 51 and 52 to casing 11.

In Embodiment 2, work windows 111 and 112 have been described as work windows for connection of output cables 42 of motor 40, a work window for connection of a terminal of a harness for power input, or work windows for various purposes may be provided.

Moreover, in Embodiment 2, inverter 13, charging apparatus 14, and junction box 15 have been described as examples of the circuit to be housed in a casing of the power conversion apparatus. However, as a circuit to be housed in a casing of the power conversion apparatus, only an inverter or a charging apparatus, or various high voltage circuits to which a high voltage is applied or in which a high voltage is generated may be employed.

Summary of Aspects of the Invention

Next, a description will be given of an overview of aspects according to the present invention.

A power conversion apparatus according to a first aspect includes: a charging apparatus that charges a battery using an external power supply; an inverter that converts a current of the battery from a direct current to an alternating-current and that supplies the alternating-current to a motor; and a junction box that relays electrical connection, in which the inverter, the charging apparatus, and the junction box are housed in a single casing, and the charging apparatus and the junction box are electrically connected to each other while the junction box and the inverter are electrically connected to each other, in which the junction box and the inverter are connected to each other via a bus bar.

A power conversion apparatus according to a second aspect is the power conversion apparatus according to the first aspect further including a DC/DC converter in the casing.

A power conversion apparatus according to a third aspect is the power conversion apparatus according to the first aspect in which the charging apparatus and the inverter are each connected to the battery via the junction box.

A power conversion apparatus according to a fourth aspect is the power conversion apparatus according to the first aspect in which the battery is installed in a rear portion or a bottom portion of a vehicle, and the junction box is installed at a position that allows the junction box to be connected to the battery in the casing with a shortest distance between the junction box and the battery.

A power conversion apparatus according to a fifth aspect is the power conversion apparatus according to the first aspect, in which the casing is internally divided into a plurality of spaces by a partition member, in which the casing includes the inverter and the junction box in different spaces, respectively, and the inverter and the junction box are connected to each other via the bus bar that passes through an opening formed in the partition member.

A power conversion apparatus according to a sixth aspect is the power conversion apparatus according to the fifth aspect, in which a portion of the partition member where the opening is formed is insulated and coated.

A power conversion apparatus according to a seventh aspect is the power conversion apparatus according to the fifth aspect, in which the junction box at least includes a portion that includes an insulation portion, that is inserted through the opening, and that serves as a connection portion for the bus bar.

A power conversion apparatus according to an eighth aspect is the power conversion apparatus according to the fifth aspect, in which the casing is internally divided into a first space and a second space by the partition member, a first casing that forms the first space and a second casing that forms the second space are separable from each other, and the first and the second casings include fastening portions in the first and the second spaces, respectively, the fastening portions being included for fastening the first and the second casings together.

A power conversion apparatus according to a ninth aspect is the power conversion apparatus according to the eighth aspect, in which the second casing includes a lid, in which, when the second casing is fastened to the first casing while being superimposed on the first casing, only the second casing includes an interlock that detects an open state of the lid of the second casing.

A power conversion apparatus according to a tenth aspect is the power conversion apparatus according to the first aspect further including: a work window that is formed in the casing and that passes through the casing from an outer side of the casing to an inner side of the casing; a plurality of lids for closing the work window; and an interlock mechanism that interlocks with open and closed states of the plurality of lids, in which the plurality of lids include a first lid and a second lid that is fixed to the casing while superimposed over a part of the first lid, in which the interlock mechanism includes: an interlock switch disposed inside the casing; and an operation portion that is formed in the second lid, the operation portion being configured to respond to the interlock switch and to turn the interlock switch.

A power conversion apparatus according to an eleventh aspect is the power conversion apparatus according to the tenth aspect further including a fastening portion at a portion where the second lid overlaps the first lid, the fastening portion being configured to fasten the first lid to the casing.

A power conversion apparatus according to a twelfth aspect is the power conversion apparatus according to the tenth aspect further including three connection portions facing the work window, the three connection portions being used for a three-phase cable for conducting a three-phase alternating-current, in which the work window includes a window hole that is long in one direction or a plurality of window holes that are aligned in one direction or combination of the window hole and the plurality of widow holes.

A power conversion apparatus according to a thirteenth aspect is the power conversion apparatus according to the twelfth aspect, in which the first lid is a metal lid and closes a portion of the work window where two of the three connection portions face the work window, and the second lid includes at least a resin-made portion and closes a portion of the work window where the remaining connection portion of the three connection portions faces the work window.

A power conversion apparatus according to a fourteenth aspect is the power conversion apparatus according to the tenth aspect, in which the first lid is a metal lid that is fixed to the casing with a gasket interposed between the lid and the casing, and the second lid includes at least a resin-made portion and is fixed to the casing with an O-ring interposed between the lid and the casing.

A power conversion apparatus according to a fifteenth aspect is the power conversion apparatus according to the first aspect, in which the inverter is an inverter circuit that outputs the alternating-current to the motor to be installed in a vehicle.

A junction box according to a sixteenth aspect includes a protruding portion to be inserted into an opening formed in a partition member of a casing that is internally divided into a plurality of spaces by the partition member, in which the protruding portion includes an insulation portion and serves as a connection portion for a bus bar.

The disclosures of Japanese Patent Applications No. 2013-078544, filed on Apr. 4, 2013, No. 2013-078546, filed on Apr. 4, 2013, and No. 2013-140526, filed on Jul. 4, 2013 including the specifications, drawings and abstracts, are incorporated herein by reference in their entireties.

INDUSTRIAL APPLICABILITY

The present invention is applicable to a power conversion apparatus to be installed in a vehicle.

REFERENCE SIGNS LIST

1 Vehicle
10 Partition member (bottom member)
11, 12 Casing
13 Inverter
14 Charging apparatus
15 Junction box
16 Bus bar
17 Opening
18 Lid
19 External power supply connection portion
20 External power supply
21 Screw
22 Screw hole
23 Insulation portion
24 Protruding portion
30 Battery
40 Motor
42 Output cable
42a Connection terminal
42b Cable clamp
51 Lid (first lid)
51a Fastening portion
52 Lid (Second lid)
522 Projection (operation portion)
52a Superimposed portion
100 Power conversion apparatus 111, 112 Work window
113 Projection
131 Connection portion
135 Interlock switch
135a Arm
511 Gasket
521 O-ring

The invention claimed is:

1. A power conversion apparatus comprising:
a charging apparatus that charges a battery using an external power supply;
an inverter that converts a current of the battery from a direct current to an alternating-current and that supplies the alternating-current to a motor; and
a junction box that relays electrical connection, wherein the inverter, the charging apparatus, and the junction box are housed in a single casing,
the charging apparatus and the junction box are electrically connected to each other while the junction box and the inverter are electrically connected to each other, wherein
the charging apparatus and the inverter are each connected to the battery via the junction box,
the charging apparatus charges the battery via the junction box,
the inverter is supplied with a current from the battery via the junction box,
the junction box and the inverter are connected to each other via a bus bar, and
the casing is internally divided into a plurality of spaces by a partition member, wherein the casing includes the inverter and the junction box in different spaces, respectively.

2. The power conversion apparatus according to claim 1, further comprising a DC/DC converter in the casing.

3. The power conversion apparatus according to claim 1, wherein
the battery is installed in a rear portion or a bottom portion of a vehicle, and
the junction box is installed at a position that allows the junction box to be connected to the battery in the casing with a shortest distance between the junction box and the battery.

4. The power conversion apparatus according to claim 1, wherein
the inverter and the junction box are connected to each other via the bus bar that passes through an opening formed in the partition member.

5. The power conversion apparatus according to claim 4, wherein a portion of the partition member where the opening is formed is insulated and coated.

6. The power conversion apparatus according to claim 4, wherein the junction box at least includes a portion that includes an insulation portion, that is inserted through the opening, and that serves as a connection portion for the bus bar.

7. The power conversion apparatus according to claim 1, wherein
the casing is internally divided into a first space and a second space by the partition member,
a first casing that forms the first space and a second casing that forms the second space are separable from each other, and
the first and the second casings include fastening portions in the first and the second spaces, respectively, the fastening portions being included for fastening the first and the second casings together.

8. The power conversion apparatus according to claim 7, wherein
the second casing includes a lid, wherein,
when the second casing is fastened to the first casing while being superimposed on the first casing, only the second casing includes an interlock that detects an open state of the lid of the second casing.

9. The power conversion apparatus according to claim 1, further comprising:
a work window that is formed in the casing and that passes through the casing from an outer side of the casing to an inner side of the casing;
a plurality of lids for closing the work window; and
an interlock mechanism that interlocks with open and closed states of the plurality of lids, wherein
the plurality of lids include a first lid and a second lid that is fixed to the casing while superimposed over a part of the first lid, wherein
the interlock mechanism includes:
an interlock switch disposed inside the casing; and
an operation portion that is formed in the second lid, the operation portion being configured to respond to the interlock switch and to turn the interlock switch.

10. The power conversion apparatus according to claim 9, further comprising a fastening portion at a portion where the second lid overlaps the first lid, the fastening portion being configured to fasten the first lid to the casing.

11. The power conversion apparatus according to claim 9, further comprising three connection portions facing the work window, the three connection portions being used for a three-phase cable for conducting a three-phase alternating-current, wherein
the work window includes a window hole that is long in one direction or a plurality of window holes that are aligned in one direction or combination of the window hole and the plurality of widow holes.

12. The power conversion apparatus according to claim 11, wherein
the first lid is a metal lid and closes a portion of the work window where two of the three connection portions face the work window, and
the second lid includes at least a resin-made portion and closes a portion of the work window where the remaining connection portion of the three connection portions faces the work window.

13. The power conversion apparatus according to claim 9, wherein
the first lid is a metal lid that is fixed to the casing with a gasket interposed between the lid and the casing, and
the second lid includes at least a resin-made portion and is fixed to the casing with an O-ring interposed between the lid and the casing.

14. A junction box comprising a protruding portion to be inserted into an opening formed in a partition member of a casing that is internally divided into a plurality of spaces by the partition member, wherein
the junction box is electrically connected to a charging apparatus and an inverter, the charging apparatus being housed in the casing and charging a battery using an external power supply, and the inverter converting a current of the battery from a direct current to an alternating-current and supplying the alternating-current to a motor, and
the protruding portion includes an insulation portion and serves as a connection portion for a bus bar that passes through the opening and connects another device.

* * * * *